(12) United States Patent
Kitada (10) Patent No.: US 8,529,025 B2
(45) Date of Patent: Sep. 10, 2013

(54) PIEZOELECTRIC ELEMENT, LIQUID EJECTING HEAD, AND LIQUID EJECTING APPARATUS

(75) Inventor: Kazuya Kitada, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/312,660

(22) Filed: Dec. 6, 2011

(65) Prior Publication Data
US 2012/0147098 A1 Jun. 14, 2012

(30) Foreign Application Priority Data
Dec. 9, 2010 (JP) ................................ 2010-275166

(51) Int. Cl.
*B41J 2/045* (2006.01)
(52) U.S. Cl.
USPC .................................................. 347/68
(58) Field of Classification Search
None
See application file for complete search history.

(56) References Cited

U.S. PATENT DOCUMENTS

| | | | |
|---|---|---|---|
| 7,575,304 B2 * | 8/2009 | Sugahara | 347/68 |
| 7,626,217 B2 * | 12/2009 | Saxler | 257/194 |
| 7,959,823 B2 * | 6/2011 | Fukuoka et al. | 252/62.9 R |
| 2006/0091494 A1 * | 5/2006 | Miyamoto et al. | 257/532 |
| 2009/0302715 A1 | 12/2009 | Shibata et al. | |

FOREIGN PATENT DOCUMENTS

| | | |
|---|---|---|
| JP | 2001-223404 | 8/2001 |
| JP | 2009-130182 | 6/2009 |
| JP | 2009-295786 | 12/2009 |

* cited by examiner

*Primary Examiner* — Matthew Luu
*Assistant Examiner* — Erica LIn
(74) *Attorney, Agent, or Firm* — Workman Nydegger (57) ABSTRACT

A piezoelectric element has a first electrode containing platinum, a piezoelectric layer formed above the first electrode, and a second electrode formed on the piezoelectric layer. The piezoelectric layer is composed of an oxide containing potassium, sodium, niobium, bismuth, and iron.

4 Claims, 10 Drawing Sheets

PIEZOELECTRIC ELEMENT, LIQUID EJECTING HEAD, AND LIQUID EJECTING APPARATUS

CROSS-REFERENCE TO RELATED APPLICATIONS

The entire disclosure of Japanese Patent Application No. 2010-275166, filed Dec. 9, 2010 is expressly incorporated by reference.

BACKGROUND

1. Technical Field

The present invention relates to a liquid ejecting head and a liquid ejecting apparatus both having pressure chambers and piezoelectric elements. The pressure chambers communicate with nozzle openings, and the piezoelectric elements each have a piezoelectric layer and electrodes for energizing the piezoelectric layer and can change the pressure in the pressure chambers. The invention also relates to such a piezoelectric element.

2. Related Art

A typical form of piezoelectric element is a piezoelectric material having an electromechanical conversion function, such as a piezoelectric layer (a piezoelectric film) composed of a crystalline piezoelectric material and sandwiched between two electrodes. This type of piezoelectric element can be used in liquid ejecting heads as flexural-vibration-based actuators. Typical examples of liquid ejecting heads are ink jet recording heads. An ink jet recording head has nozzle openings for ejecting ink droplets, and these nozzle openings communicate with pressure chambers. These pressure chambers share a diaphragm as one of their components. Piezoelectric elements vibrate to deform the diaphragm, and the deformed diaphragm pressurizes the ink contained in appropriate pressure chambers to eject it from appropriate nozzle openings in the form of droplets.

Piezoelectric materials used to form this type of piezoelectric layer should have good piezoelectric properties. A typical example is lead zirconate titanate (PZT) (see JP-A-2001-223404). Recently, however, environment-conscious people have called for low-lead piezoelectric materials. Some examples of lead-free piezoelectric materials are KNN-based ones, which contain potassium (K), sodium (Na), and niobium (Nb). KNN-based materials have a high Curie point and excellent electric properties.

Unfortunately, however, KNN-based piezoelectric materials allow electricity to leak therethrough and are poor insulators. This type of problem is not unique to ink jet recording heads and other kinds of liquid ejecting heads; similar problems may be encountered with piezoelectric elements for other devices.

SUMMARY

An advantage of some aspects of the invention is that they provide a liquid ejecting head and a liquid ejecting apparatus both featuring reduced leakage current and improved insulation owing to the characteristics of their piezoelectric elements. Furthermore, such a piezoelectric element is also provided.

To solve the problems described above, an aspect of the invention provides a liquid ejecting head having a pressure chamber communicating with a nozzle opening and a piezoelectric element having a first electrode containing platinum, a piezoelectric layer formed on the first electrode and composed of an oxide containing potassium, sodium, niobium, bismuth, and iron, and a second electrode formed on the piezoelectric layer.

In this aspect, the piezoelectric layer composed of an oxide containing potassium, sodium, niobium, bismuth, and iron is formed on the first electrode containing platinum in order for leakage current to be reduced and insulation to be improved.

Preferably, the piezoelectric layer contains more bismuth on the first electrode side than in the middle of its thickness. As a result, the liquid ejecting head offers further reduced leakage current and further improved insulation owing to its piezoelectric layer containing more bismuth on the first electrode side in addition to being composed of an oxide containing potassium, sodium, niobium, bismuth, and iron.

It is also preferred that the piezoelectric layer contains more iron on the first electrode side than in the middle of its thickness. This also results in the liquid ejecting head offering further reduced leakage current and further improved insulation owing to its piezoelectric layer containing more iron on the first electrode side in addition to being composed of an oxide containing potassium, sodium, niobium, bismuth, and iron.

Another aspect of the invention provides a liquid ejecting apparatus. The liquid ejecting apparatus according to this aspect has the liquid ejecting head described above and is highly reliable owing to the reduced leakage current and improved insulation of this liquid ejecting head.

Yet another aspect of the invention provides a piezoelectric element. This piezoelectric element has a first electrode containing platinum, a piezoelectric layer formed on the first electrode and composed of an oxide containing potassium, sodium, niobium, bismuth, and iron, and a second electrode formed on the piezoelectric layer. In this aspect, the piezoelectric layer composed of an oxide containing potassium, sodium, niobium, bismuth, and iron is formed on the first electrode containing platinum in order for leakage current to be reduced and insulation to be improved.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiment 1

Figure 1:
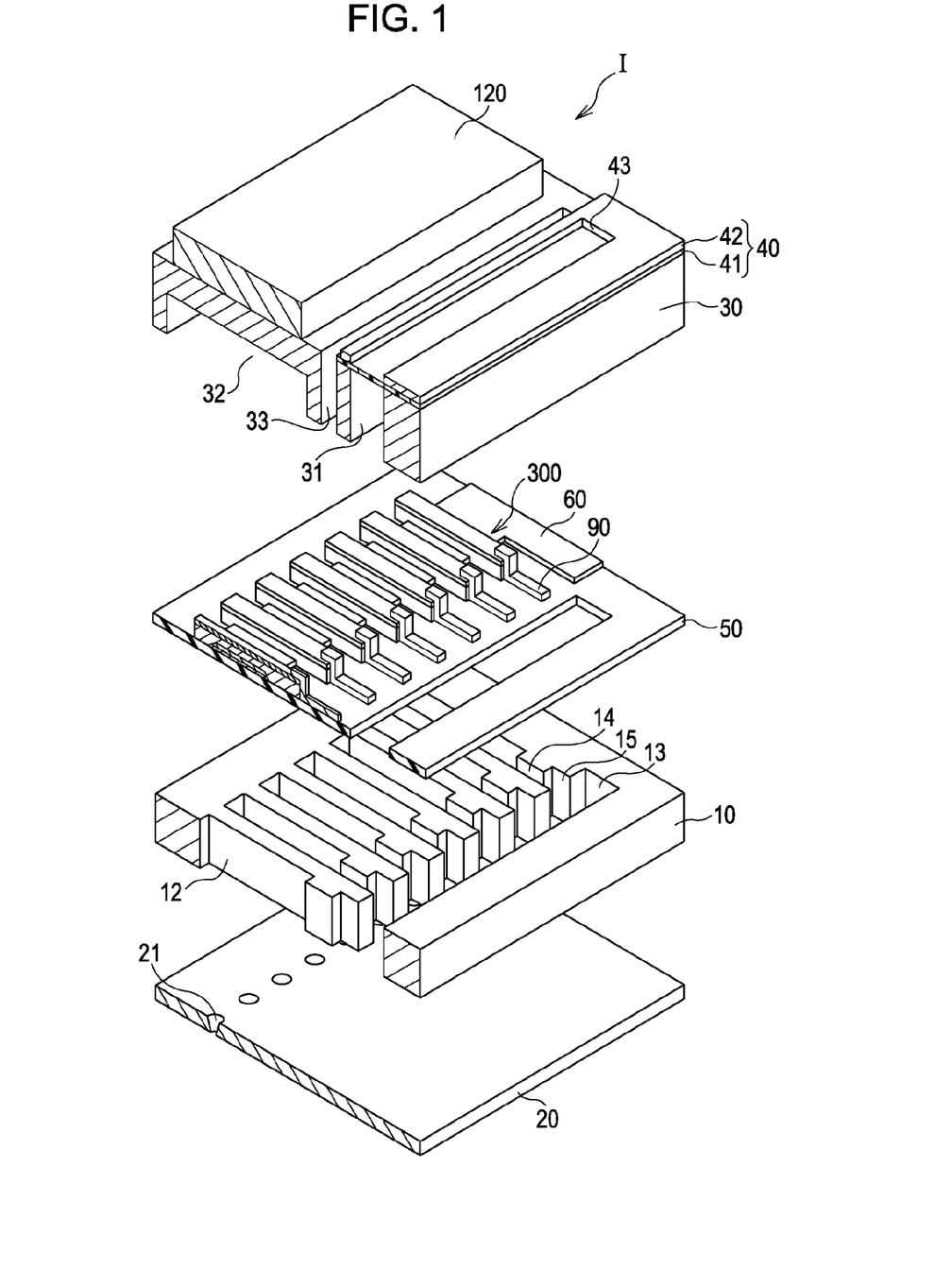
FIG. 1 is an exploded perspective diagram illustrating a schematic constitution of a recording head according to Embodiment 1.
Figure 2:
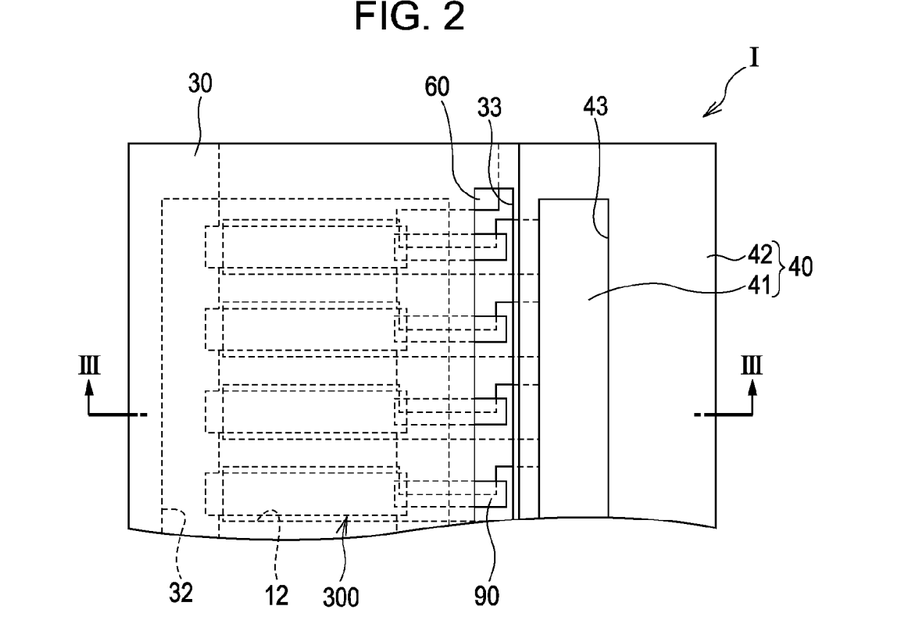
FIG. 2 is a plan view of the recording head according to Embodiment 1.
Figure 3:
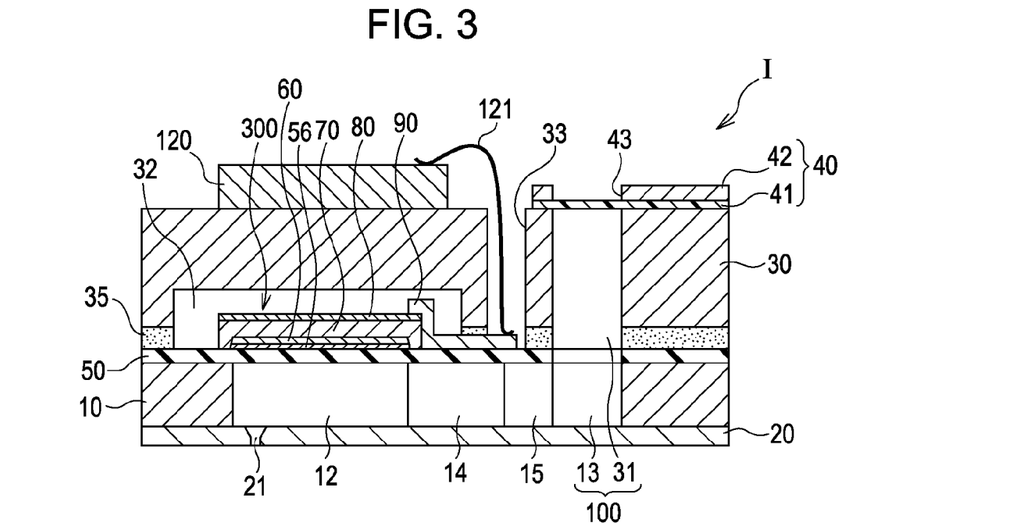
FIG. 3 is a cross-sectional view of the recording head according to Embodiment 1.

FIG. 1 is an exploded perspective diagram illustrating a schematic constitution of an ink jet recording head, which is an example of the liquid ejecting head according to Embodiment 1 of the invention, FIG. 2 is a plan view of FIG. 1, and FIG. 3 is a cross-sectional diagram taken along line III-III of FIG. 2. As illustrated in FIGS. 1 to 3, in this embodiment, a flow channel substrate 10, which is a silicon single crystal substrate, is covered on either side with an elastic film 50, which is made of silicon dioxide.

The flow channel substrate 10 has several pressure chambers 12 arranged in parallel. Either one of the regions of the flow channel substrate 10 extending outside the longitudinal ends of the pressure chambers 12 has a communicating space 13, and the communicating space 13 communicates with the pressure chambers 12 via ink supply paths 14 and communicating paths 15, both formed in correspondence with the pressure chambers 12. The communicating space 13 also communicates with a manifold portion 31 of a protective substrate 30 (described later) to serve as a component of a manifold 100, a common ink tank for the pressure chambers 12. The ink supply paths 14 are narrower than the pressure chambers 12, and they work to maintain the resistance to which ink is exposed when it flows from the communicating space 13 into the pressure chambers 12. In this embodiment, the ink supply paths 14 are formed by making a projection on only one lateral side in each branch of the flow channel; however, they may be formed by making a projection on both lateral sides in each branch of the flow channel. Or they may be formed by making a projection on the top, the bottom, or both in each branch of the flow channel. In summary, the flow channel substrate 10 in this embodiment has a flow channel defined by the pressure chambers 12, the communicating space 13, the ink supply paths 14, and the communicating paths 15.

To the opening side of the flow channel substrate 10 a nozzle plate 20, which is drilled in advance to have nozzle openings 21 communicating with the pressure chambers 12 near the ends opposite those having the ink supply paths 14, is bonded with an adhesive agent, hot-melt film, or some other adhesive material. The nozzle plate 20 can be made of a glass ceramic material, silicon single crystals, stainless steel, or any other appropriate material.

On the side of the flow channel substrate 10 opposite the opening side, an elastic film 50 is formed as described above. This elastic film 50 is coated with an adhesive layer 56, which is, for example, a titanium oxide film having a thickness on the order of 30 to 50 nm and works to improve the adhesion between a first electrode 60 and its base including the elastic film 50. If necessary, the elastic film 50 may be coated with an insulating film made of zirconium oxide or any other similar material.

On this adhesive layer 56, furthermore, a first electrode 60, a piezoelectric layer 70 (a thin film having a thickness equal to or smaller than 2 µm or preferably in a range of 0.3 to 1.5 µm), and a second electrode 80 are stacked to form piezoelectric elements 300. Each piezoelectric element 300 is a portion including the first electrode 60, the piezoelectric layer 70, and the second electrode 80. Usually, either of the two electrodes of the piezoelectric elements 300 is used as a common electrode, and the other electrode and the piezoelectric layer 70 are patterned to fit the pressure chambers 12. In this embodiment, the first electrode 60 provides a common electrode for the piezoelectric elements 300, and the second electrode 80 provides separate electrodes for the piezoelectric elements 300; however, this assignment may be reversed depending on the arrangement of the driving circuit or wiring involved. In addition, each piezoelectric element 300 and a portion (of a diaphragm) displaced by the movement of the piezoelectric element 300 are collectively referred to as an actuator. In the constitution described above, the elastic film 50, the adhesive layer 56, and the first electrode 60, and optionally the insulating film mentioned above serve as the diaphragm; however, of course, this is not the only possible constitution of the diaphragm. For example, the elastic film 50, the adhesive layer 56, or both may be omitted. Or the piezoelectric elements 300 themselves may serve as the diaphragm.

The first electrode 60 mentioned above contains platinum (Pt). And the piezoelectric layer 70 on the first electrode 60 is composed of an oxide containing potassium (K), sodium (Na), niobium (Nb), bismuth (Bi), and iron (Fe) or, in other words, is made of a piezoelectric material containing K, Na, Nb, Bi, Fe, and O.

There is no limitation on the structure of this piezoelectric material containing K, Na, Nb, Bi, Fe, and O; however, preferably, the perovskite structure is predominant in this material.

In this embodiment, furthermore, the piezoelectric layer 70 contains more Bi on the first electrode 60 side than in the middle of its thickness. In other words, Bi is segregated on the first electrode 60 side of the piezoelectric layer 70. For example, a portion of the piezoelectric layer 70 near the interface with the first electrode 60 contains more Bi than a portion in the middle of the thickness of the piezoelectric layer 70 does. Additionally, the piezoelectric layer 70 may contain more Bi on the second electrode 80 side than in the middle of its thickness. In this embodiment, the piezoelectric layer 70 also contains Fe more on the first electrode 60 side than in the middle of its thickness. In other words, Fe is also segregated on the first electrode 60 side of the piezoelectric layer 70. For example, a portion of the piezoelectric layer 70 near the interface with the first electrode 60 contains more Fe than a portion in the middle of the thickness of the piezoelectric layer 70 does.

When the first electrode 60 and the piezoelectric layer 70 are constituted as described above to contain Pt and to be composed of a piezoelectric material containing K, Na, Nb, B, Fe, and O, respectively, the diffusion of Pt toward the piezoelectric layer 70 is prevented, as also demonstrated later in Examples; thus, the piezoelectric elements 300 can be less likely to generate leakage current and can offer improved insulation without such a current-blocking layer as that described in JP-A-2009-130182 despite the use of a KNN-based material containing K, Na, and Nb. When the piezoelectric layer is composed of a piezoelectric material that contains K, Na, and Nb but no Bi or Fe, however, a large amount of Pt diffuses toward the piezoelectric layer, and this leads to deteriorated insulation.

The second electrode 80, which is actually separate electrodes for the piezoelectric elements 300 constituted as above, is connected to lead electrodes 90, which is made of gold (Au) or any other appropriate material and each of which extends from near the end of the corresponding separate electrode closer to the ink supply path 14 to the elastic film 50 (or the insulating film if it is formed).

The upper side of the flow channel substrate 10 having the piezoelectric elements 300 constituted as above or, more specifically, the first electrode 60, the elastic film 50, and the lead electrodes 90 (and the insulating film if it is formed) are covered with a protective substrate 30, which has a manifold portion 31 serving as at least a component of a manifold 100 and is bonded thereto with adhesive agent 35. In this embodiment, the manifold portion 31 is formed through the entire thickness of the protective substrate 30 and extends along the direction of the width of the pressure chambers 12 and, as mentioned above, communicates with the communicating space 13 of the flow channel substrate 10 to form the manifold 100, a common ink tank for the pressure chambers 12. Or the communicating space 13 of the flow channel substrate 10 may be divided into several portions corresponding to the pressure chambers 12 so that the manifold portion 31 can solely serve as the manifold 100. Other constitutions may also be allowed; in a possible constitution, for example, only the pressure chambers 12 are formed in the flow channel substrate 10, and the ink supply paths 14 are formed in the portion between the flow channel substrate 10 and the protective substrate (e.g., the elastic film 50, and the insulating film if it is formed) to ensure the communication between the manifold 100 and the pressure chambers 12.

The protective substrate 30 further has, in a portion facing the piezoelectric elements 300, a piezoelectric element housing 32 having a space large enough to allow the piezoelectric elements 300 to operate. As long as the piezoelectric element housing 32 has a space large enough to allow the piezoelectric elements 300 to operate, it does not matter whether or not the space is tightly sealed.

Preferably, the protective substrate 30 constituted as above is made of a material having a coefficient of thermal expansion approximately equal to that of the flow channel substrate 10, for example, glass or a ceramic material. In this embodiment, it is formed as a silicon single crystal substrate from the same material as the flow channel substrate 10.

Furthermore, the protective substrate 30 has a through-hole 33 formed through the entire thickness of the protective substrate 30. And the individual lead electrodes 90, extending from their corresponding piezoelectric elements 300, are exposed inside the through-hole 33 near one of their ends.

On the protective substrate 30 a driving circuit 120 for driving the parallelly arranged piezoelectric elements 300 is also mounted. This driving circuit 120 may be a printed circuit board, a semiconductor integrated circuit (IC), or any other appropriate kind of circuit. And the driving circuit 120 and the lead electrodes 90 are connected via wiring 121 based on conductive wires such as bonding wires.

To the protective substrate 30 constituted as above, additionally, a compliance substrate 40 having a sealing film 41 and a stationary plate 42 is bonded. Here, the sealing film 41 is made of a low-rigidity flexible material, and the manifold portion 31 is sealed with this sealing film 41 on either side. On the other hand, the stationary plate 42 is made of a relatively hard material. This stationary plate 42 has an opening 43 formed through its entire thickness over the area facing the manifold 100; thus, the manifold 100 is sealed on either side only with the flexible sealing film 41.

Constituted as above, the ink jet recording head I of this embodiment receives ink from an external ink source (not illustrated in the drawings), fills the entire space from the manifold 100 to the nozzle openings 21 with the ink, and then, in response to recording signals transmitted from the driving circuit 120, distributes voltage to the first electrode 60 and the second electrode 80 so that the elastic film 50, the adhesive layer 56, the first electrode 60, and the piezoelectric layer 70 should be deformed at the positions corresponding to appropriate ones of the pressure chambers 12; as a result, the appropriate ones of the pressure chambers 12 are pressurized to eject ink droplets through the corresponding nozzle openings 21.

The following describes a typical method for manufacturing an ink jet recording head according to this embodiment with reference to FIGS. 4A to 8B. FIGS. 4A to 8B illustrate a cross-section of a pressure chamber 12 taken in the longitudinal direction.

Figure 4A:
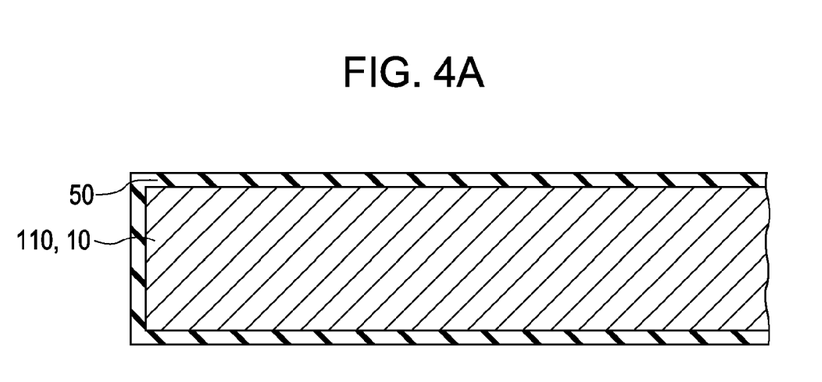
FIGS. 4A and 4B are cross-sectional diagrams illustrating a manufacturing process of a recording head according to Embodiment 1.
Figure 4B:
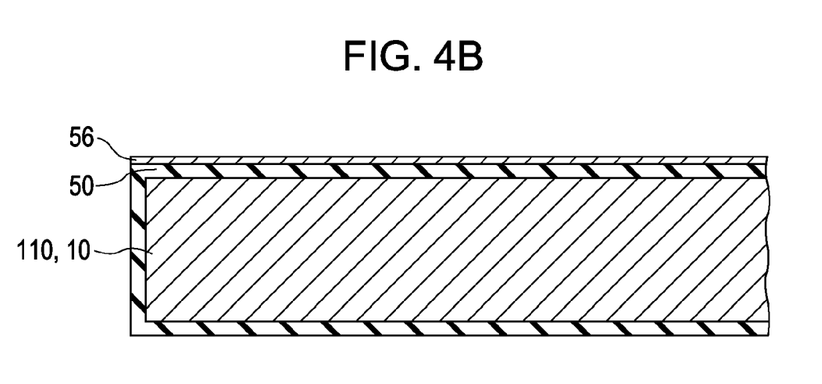

First, as illustrated in FIG. 4A, a silicon dioxide film is formed as an elastic film 50 on a flow channel substrate wafer 110, which is a silicon wafer large enough to be divided into several flow channel substrates 10, from silicon dioxide ($SiO_2$) or any other similar compound by thermal oxidation or any other appropriate technique. Then, an adhesive layer 56 is formed on the elastic film 50 (the silicon dioxide film) as illustrated in FIG. 4B, from titanium oxide or any other similar compound by sputtering, thermal oxidation, or any other appropriate technique.

Figure 5A:
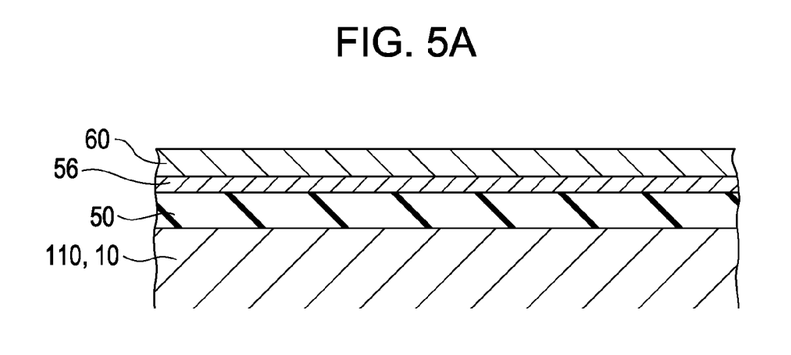
FIGS. 5A to 5C are cross-sectional diagrams illustrating the manufacturing process of a recording head according to Embodiment 1.

Then, a platinum film is formed on the entire surface of the adhesive layer 56 to provide a first electrode 60 as illustrated in FIG. 5A, by sputtering or any other appropriate technique.

Then, a piezoelectric layer 70 is formed on this platinum film. The piezoelectric layer 70 can be formed by MOD (metal-organic decomposition, in which solutions each containing a metal-organic compound are applied and the coating is dried and fired at a high temperature to leave a piezoelectric layer or film composed of a metal oxide), the sol-gel method, and other chemical solution methods as well as by sputtering and other gas phase methods.

More specifically, a piezoelectric precursor film is formed from a selected kind of composition that can form piezoelectric films (hereinafter the piezoelectric composition) and then the piezoelectric precursor film is heated to leave a crystalline film, which is the piezoelectric layer 70. In the invention, the piezoelectric composition contains K, Na, Nb, Bi, and Fe.

When this piezoelectric composition containing K, Na, Nb, Bi, and Fe is turned into a crystalline film by heating as above, the resulting piezoelectric layer 70 will be composed of a piezoelectric material containing K, Na, Nb, Bi, Fe, and O. In this embodiment, the perovskite structure is predominant in this piezoelectric layer 70.

Preferably, the amounts of K, Na, Nb, Bi, and Fe in the piezoelectric composition follow a relation K:Na:Nb:Bi:Fe= $(1-x):x:1:a:a$ ($0<x<1$, $0.01 \leq a \leq 0.05$). This relation ensures, in particular, that leakage current is reduced. When the parameter a is greater than 0.05, phases having a structure other than the perovskite can occur.

Figure 5B:
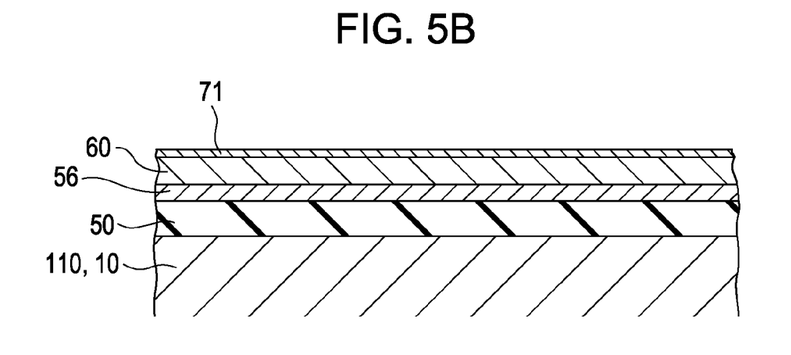

A detailed procedure for forming the piezoelectric layer 70 by a chemical solution method is as follows. First, a piezoelectric precursor film 71 is formed on the platinum film as illustrated in FIG. 5B, from metal-organic compounds or, more specifically, metal-organic compounds individually containing K, Na, Nb, Bi, or Fe by applying, by spin coating or any other appropriate technique, the piezoelectric composition in the form of a solution for MOD or a sol containing these compounds and satisfying a relation K:Na:Nb:Bi:Fe= $(1-x):x:1:a:a$ ($0<x<1$, $0.01 \leq a \leq 0.05$) (hereinafter, the precursor solution). (This is named the coating process.)

The precursor solution to be applied is obtained by mixing metal-organic compounds individually containing K, Na, Nb, Bi, or Fe and dissolving the mixture in an alcohol or any other appropriate organic solvent. The metal-organic compounds individually containing K, Na, Nb, Bi, or Fe may be in the form of, for example, metal alkoxides or metal-organic complexes. Examples of metal-organic compounds containing K include potassium 2-ethylhexanoate, potassium acetate, potassium acetylacetonate, and potassium tert-butoxide. Examples of metal-organic compounds containing Na include sodium 2-ethylhexanoate, sodium acetate, sodium acetylacetonate, and sodium tert-butoxide. Examples of metal-organic compounds containing Nb include niobium 2-ethylhexanoate and niobium pentaethoxide. An example of metal-organic compounds containing Bi is bismuth 2-ethylhexanoate. And an example of metal-organic compounds containing Fe is iron 2-ethylhexanoate. As a matter of course, metal-organic compounds containing two or more of K, Na, Nb, Bi, and Fe can also be used.

Then, the piezoelectric precursor film 71 is heated and dried at a certain temperature (e.g., a temperature in a range of 120 to 200° C.) for a certain period of time (the drying process). The dried piezoelectric precursor film 71 is then further heated and kept at a constant temperature (e.g., a temperature in a range of 300 to 450° C.) for a certain period of time so that it can be defatted (the defatting process). The term defatting used here represents removing organic substances from the piezoelectric precursor film 71 by changing them into $NO_2$, $CO_2$, $H_2O$, or other chemical species. No limitation is placed on the atmosphere used during the drying and defatting processes; it may be air, oxygen, an inert gas, or any other appropriate atmosphere. The coating, drying, and defatting processes may be repeated two or more times.

Figure 5C:
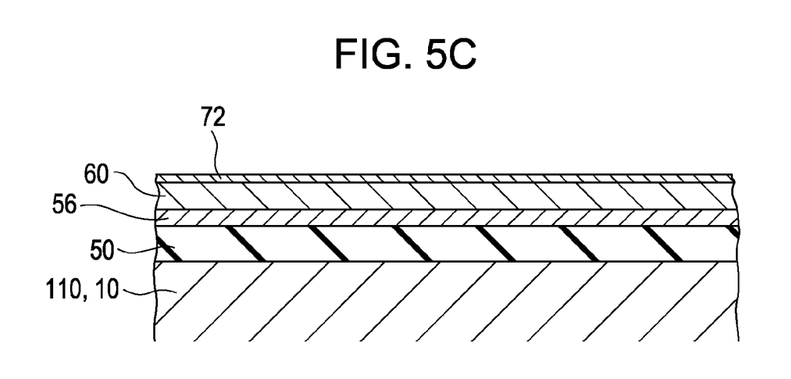

Then, a piezoelectric film 72 composed of a piezoelectric material containing K, Na, Nb, Bi, Fe, and O is formed as illustrated in FIG. 5C, by heating the piezoelectric precursor film 71 at a certain temperature, for example, a temperature on the order of 600 to 800° C., and keeping it at that temperature for a certain period of time so that a crystalline film should be left (the firing process). No limitation is also placed on the atmosphere used during this firing process; it may be air, oxygen, an inert gas, or any other appropriate atmosphere. The use of a KNN-based material causes the problem of leakage current and deteriorated insulation during this firing process because Pt contained in the first electrode 60 diffuses into the piezoelectric layer 70; however, in the invention, Bi and Fe contained in the material prevent Pt from diffusing into the piezoelectric layer 70, thereby reducing the leakage current and improving the insulation. The piezoelectric layer 70 obtained in the way described above contains Bi and Fe more on the first electrode 60 side than in the middle of the thickness of the piezoelectric layer 70. And it is a composite oxide in which a perovskite structure containing K, Na, Nb, Bi, Fe, and O is predominant.

Examples of heaters that can be used in the drying, defatting, and firing processes include RTA (rapid thermal annealing) systems, which heat the target substance by infrared radiation, and hot plates.

While the above is a procedure for forming the piezoelectric layer 70 by a chemical solution method, this layer may be formed by, as mentioned above, sputtering or any other appropriate technique.

Figure 6A:
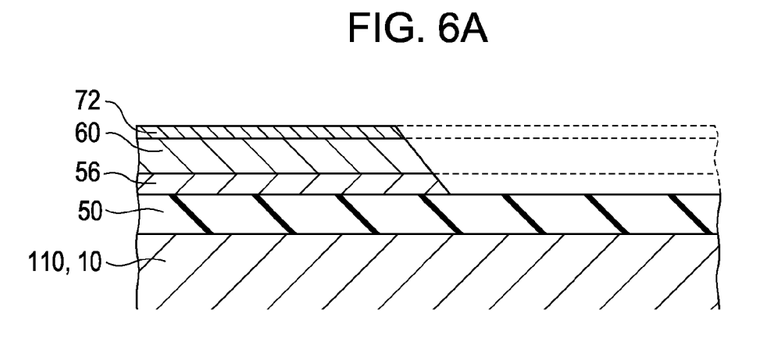
FIGS. 6A and 6B are cross-sectional diagrams illustrating the manufacturing process of a recording head according to Embodiment 1.

Then, the first electrode 60 and the (first) piezoelectric film 72 are patterned together to have a common inclined plane on their lateral side as illustrated in FIG. 6A, with a patterned resist placed on the piezoelectric film 72 as a mask (not illustrated).

Figure 6B:
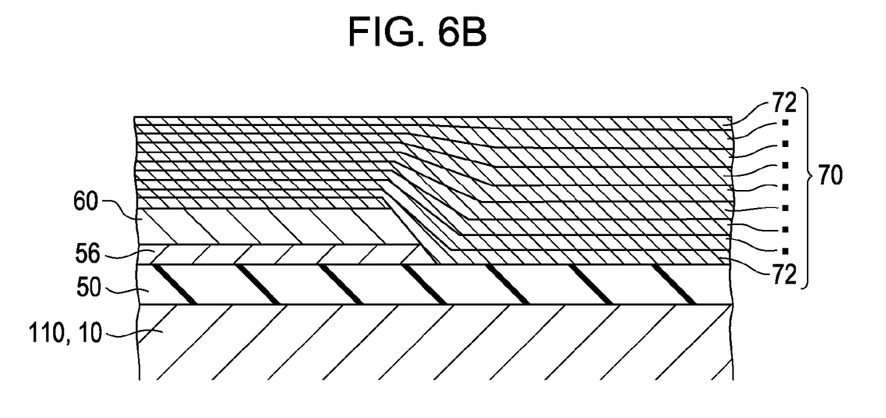

Then, after the resist is removed, the coating, drying, and defatting processes are repeated, with or without the firing process, as many times as required to achieve the intended thickness and satisfy any other conditions, making the piezoelectric layer 70 have two or more stacked piezoelectric films 72; the piezoelectric layer 70 is formed as a stack of piezoelectric films 72 as illustrated in FIG. 6B, and has the intended thickness. For example, if the precursor solution applied once gives a coating having a thickness of approximately 0.1 μm and ten piezoelectric films 72 are formed, then the total thickness of the piezoelectric layer 70 is approximately 1.1 μm. While in this embodiment a stack of piezoelectric films 72 is formed, constitutions using only one piezoelectric film 72 are also acceptable.

Figure 7A:
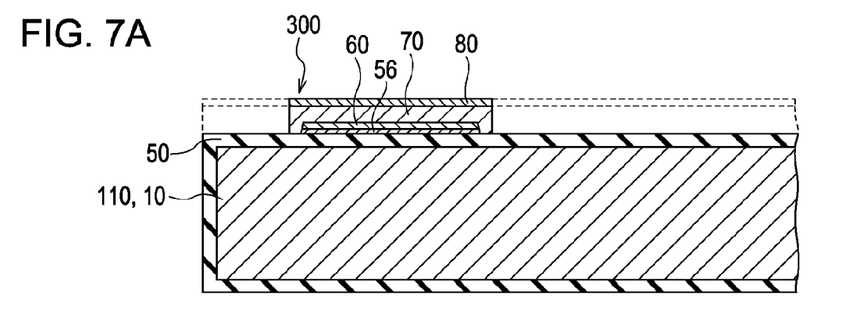
FIGS. 7A to 7C are cross-sectional diagrams illustrating the manufacturing process of a recording head according to Embodiment 1.

The process that comes after the above-described formation of the piezoelectric layer 70 is illustrated in FIG. 7A, where a second electrode 80 is formed on the piezoelectric layer 70 from platinum or any other similar material by sputtering or any other appropriate technique, and the piezoelectric layer 70 and the second electrode 80 are patterned together to be aligned with the regions where pressure chambers 12 are to be formed, completing piezoelectric elements 300 each constituted by the first electrode 60, the piezoelectric layer 70, and the second electrode 80. The piezoelectric layer 70 and the second electrode 80 can be patterned in one operation by performing dry etching through a patterned resist (not illustrated). If necessary, post-annealing at a temperature, for example, in a range of 600 to 800° C., may follow. This refines the interfaces of the piezoelectric layer 70 with the first electrode 60 and the second electrode 80 and also improves the crystallographic properties of the piezoelectric layer 70.

Figure 7B:
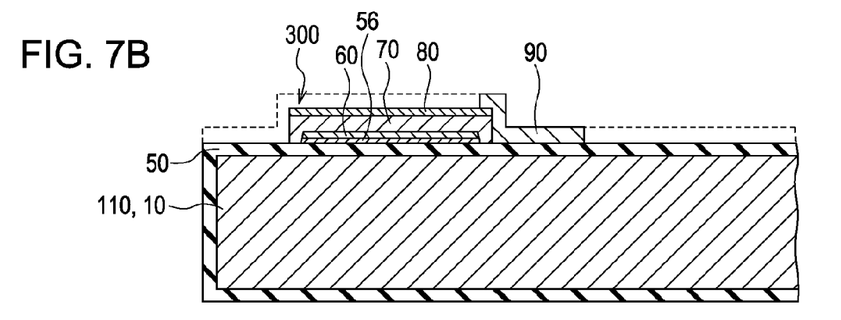

Then, as illustrated in FIG. 7B, a lead electrode 90 is formed on the entire surface of the flow channel substrate wafer 110, from gold (Au) or any other appropriate material, and patterned to leave portions corresponding to the individual piezoelectric elements 300, with a patterned resist or any other patterned material as a mask (not illustrated).

Figure 7C:
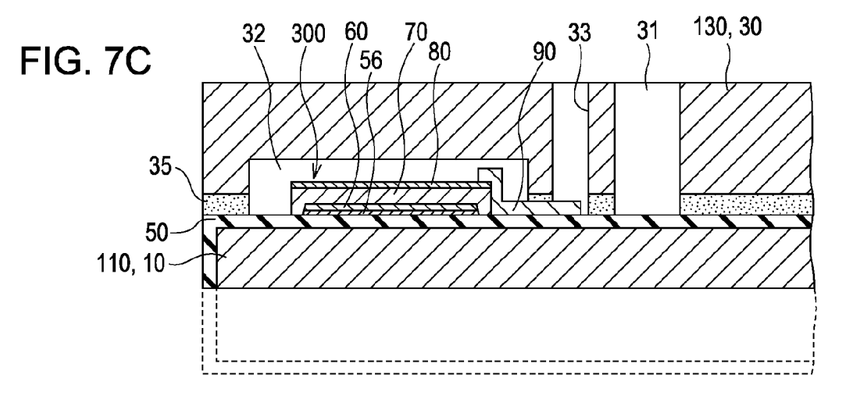

Then, as illustrated in FIG. 7C, a protective substrate wafer 130, which is a silicon wafer large enough to be divided into several protective substrates 30, is bonded to the piezoelectric element 300 side of the flow channel substrate wafer 110 with an adhesive agent 35, and the flow channel substrate wafer 110 is thinned to a desired thickness.

Figure 8A:
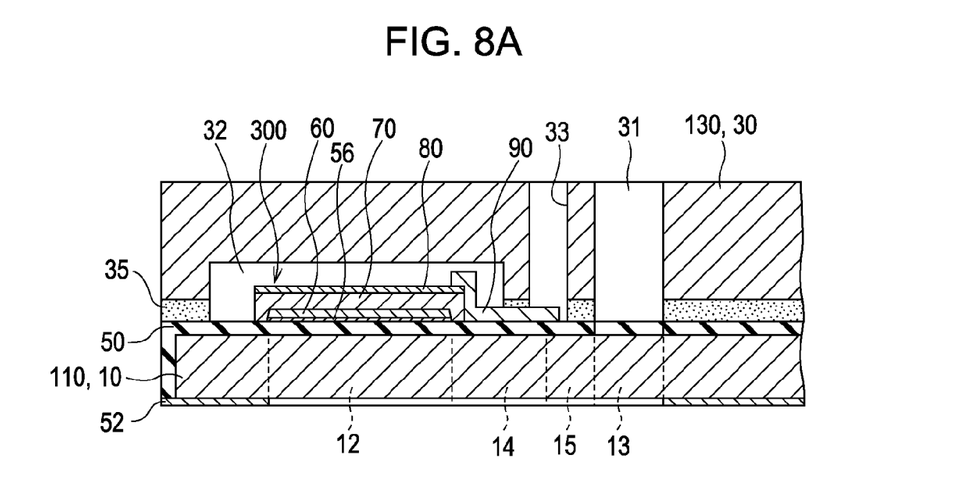
FIGS. 8A and 8B are cross-sectional diagrams illustrating the manufacturing process of a recording head according to Embodiment 1.

Then, as illustrated in FIG. 8A, a mask film 52 is newly formed on the flow channel substrate wafer 110 and patterned into a desired shape.

Figure 8B:
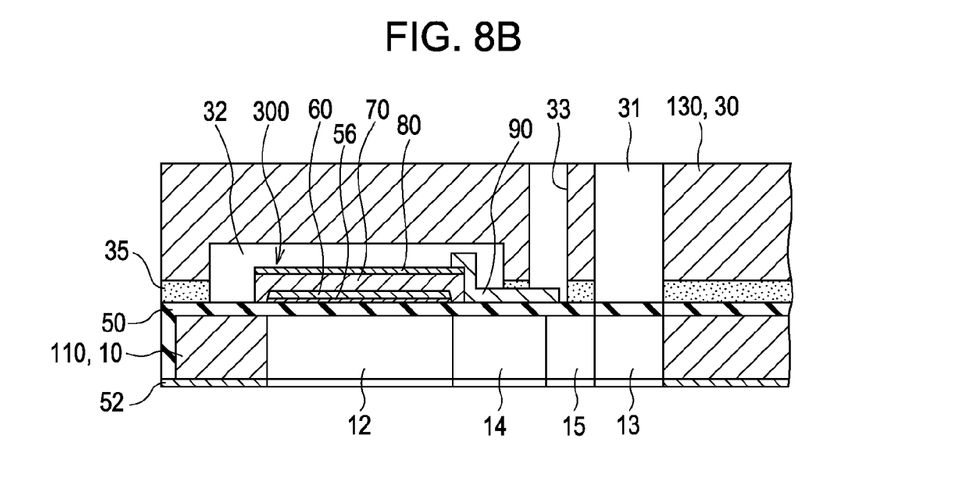

Then, as illustrated in FIG. 8B, pressure chambers 12, a communicating space 13, ink supply paths 14, communicating paths 15, and other necessary features are formed to fit each set of the piezoelectric elements 300, by anisotropically etching (wet-etching) the flow channel substrate wafer 110 through the mask film 52 with KOH or any other appropriate alkali solution.

After the processes described above are completed, the flow channel substrate wafer 110 and the protective substrate wafer 130 are trimmed by dicing or any other appropriate technique so that any unnecessary peripheral portions should be removed. The mask film 52, located on the side of the flow channel substrate wafer 110 opposite the protective substrate wafer 130, is removed. A nozzle plate 20 drilled in advance to have sets of nozzle openings 21 is bonded to that side and, at the same time, a compliance substrate 40 is bonded to the protective substrate wafer 130. The entire structure containing the flow channel substrate wafer 110 and other components is divided into equal-sized chips each composed of the flow channel substrate 10 and other components like that illustrated in FIG. 1. In this way, ink jet recording heads I according to this embodiment are obtained.

EXAMPLES

The following describes an aspect of the invention with reference to examples. Note that these examples do not limit any aspect of the invention.

Example 1

First, a silicon dioxide ($SiO_2$) film having a thickness of 1000 nm was formed on the surface of a silicon (Si) single crystal substrate by thermal oxidation. Then, a titanium oxide film having a thickness of 40 nm was formed on the $SiO_2$ film by direct-current (DC) sputtering and thermal oxidation. Then, a platinum film having a thickness of 130 nm (the first electrode 60) was formed on the titanium oxide film.

Subsequently, a piezoelectric layer 70 was formed on the first electrode 60 by spin coating. The procedure was as follows.

First, a precursor solution was prepared by mixing the following solutions in amounts satisfying a molar composition K:Na:Nb:Bi:Fe=0.5:0.5:1:0.01:0.01: potassium 2-ethylhexanoate in 1-butanol, sodium 2-ethylhexanoate in 1-butanol, niobium 2-ethylhexanoate in 1-butanol, bismuth 2-ethylhexanoate in octane, and iron 2-ethylhexanoate in xylene.

The obtained precursor solution was dropped onto the substrate having the titanium oxide film and the platinum film formed thereon, and the substrate was spun at 1500 rpm; in this way, a piezoelectric precursor film was formed (the coating process). The piezoelectric precursor film was dried at 150° C. for 2 minutes (the drying process), and the dried film was defatted at 350° C. for 4 minutes (the defatting process). After four cycles of these coating, drying, and defatting processes, the structure was fired in an oxygen atmosphere by rapid thermal annealing (RTA) at 700° C. for 5 minutes (the firing process). After two sets of this, each set consisting of the coating, drying, and defatting processes repeated four times and subsequent firing, a piezoelectric layer 70 composed of a piezoelectric material containing K, Na, Nb, Bi, Fe, and O was obtained with its total thickness, or the thickness after a total of eight times of coating, being 500 nm.

On this piezoelectric layer 70 a platinum film having a thickness of 100 nm was formed as the second electrode 80 by DC sputtering, and the platinum film was fired by RTA at 700° C. for 5 minutes. In this way, a piezoelectric element 300 was completed.

Example 2

A piezoelectric element 300 was made in the same way as in Example 1 except that the amounts of the solutions (potassium 2-ethylhexanoate in 1-butanol, sodium 2-ethylhexanoate in 1-butanol, niobium 2-ethylhexanoate in 1-butanol, bismuth 2-ethylhexanoate in octane, and iron 2-ethylhexanoate in xylene) were changed to satisfy a molar composition K:Na:Nb:Bi:Fe=0.5:0.5:1:0.03:0.03.

Example 3

A piezoelectric element 300 was made in the same way as in Example 1 except that the amounts of the solutions (potassium 2-ethylhexanoate in 1-butanol, sodium 2-ethylhexanoate in 1-butanol, niobium 2-ethylhexanoate in 1-butanol, bismuth 2-ethylhexanoate in octane, and iron 2-ethylhexanoate in xylene) were changed to satisfy a molar composition K:Na:Nb:Bi:Fe=0.5:0.5:1:0.05:0.05.

Comparative Example 1

A piezoelectric element 300 was made in the same way as in Example 1 except that the octane solution of bismuth 2-ethylhexanoate and the xylene solution of iron 2-ethylhexanoate were not used. The molar composition of the remaining metal elements was K:Na:Nb=0.5:0.5:1.

Test 1

Figure 9:
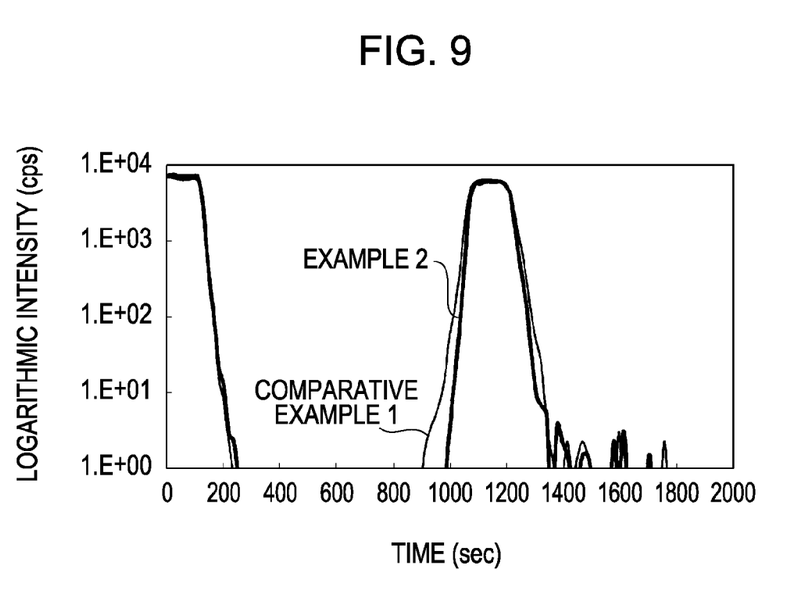
FIG. 9 illustrates SIMS spectra for Pt obtained in Example 2 and Comparative Example 1.
Figure 10:
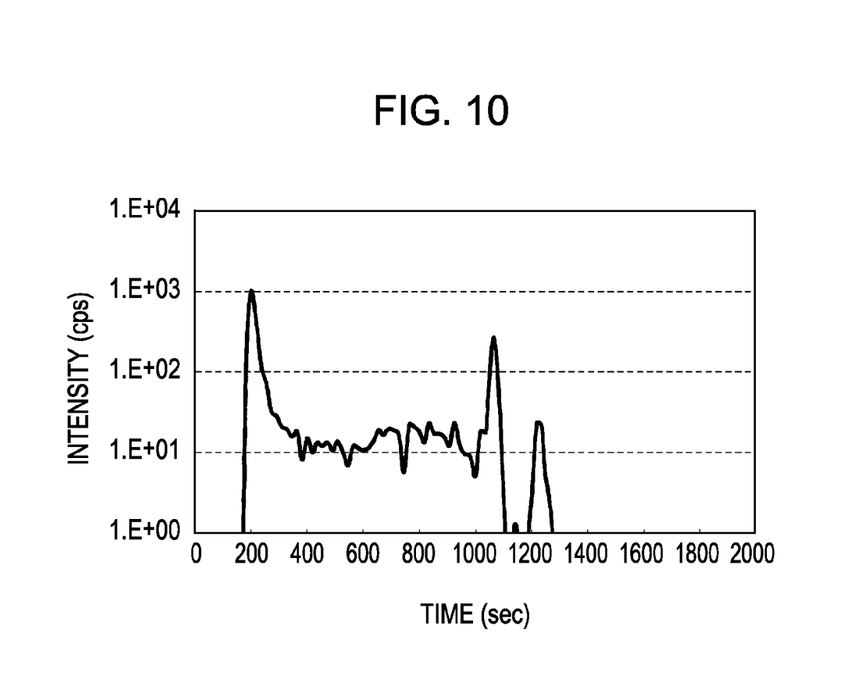
FIG. 10 illustrates a SIMS spectrum for Bi obtained in Example 2.
Figure 11:
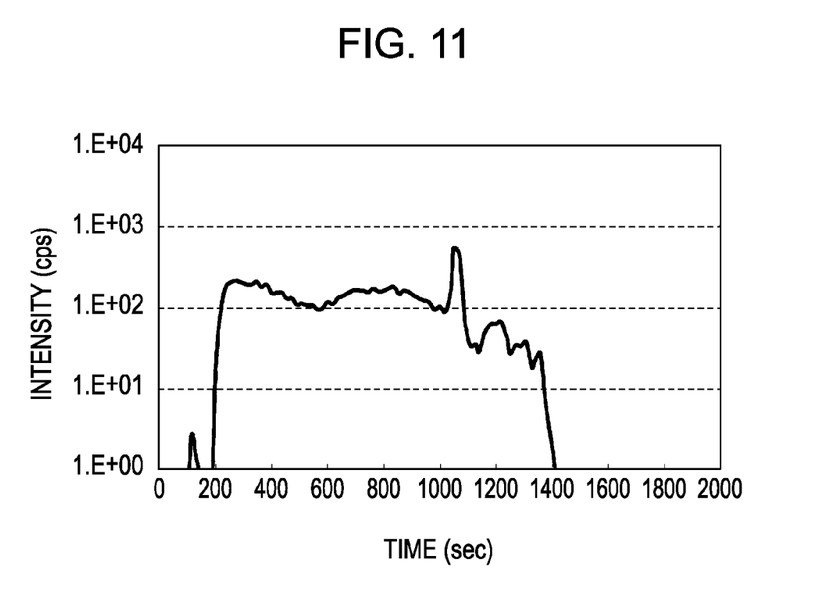
FIG. 11 illustrates a SIMS spectrum for Fe obtained in Example 2.

The substrate-mounted piezoelectric elements of Examples 1 to 3 and Comparative Example 1 were analyzed for the amounts of K, Na, Nb, Bi, Fe, and O by scanning in the thickness direction down from the second electrode using IMS 7f secondary ion mass spectrometer (SIMS; CAMECA SAS). As an example of the results, the Pt measurements of Example 2 and Comparative Example 1 are presented in FIG. 9. And FIGS. 10 and 11 present the Bi and Fe measurements of Example 2. In FIGS. 9 to 11, the horizontal axis corresponds to the distance from the second electrode (left) to the substrate (right).

In Examples 1 to 3, the piezoelectric layer formed between the first and second electrodes contained K, Na, Nb, Bi, Fe, and O. As for Comparative Example 1, the piezoelectric layer formed between the first and second electrodes contained K, Na, and Nb. Pt had diffused from the first electrode into the piezoelectric layer in a smaller amount in Examples 1 to 3 than in Comparative Example 1.

In Examples 1 to 3, furthermore, the piezoelectric layer contained more Bi and Fe near the interface with the first electrode than in the middle of its thickness.

Test 2

The piezoelectric elements of Examples 1 to 3 and Comparative Example 1 were analyzed for the X-ray diffraction pattern of their piezoelectric layer by X-ray diffractometry using D8 DISCOVER (Bruker AXS) at room temperature with CuKα radiation as the X-ray source. In all of Examples 1 to 3 and Comparative Example 1, the analysis found only peaks attributable to the perovskite structure and the substrate; no peaks attributable to other phases were found.

Test 3

Figure 12:
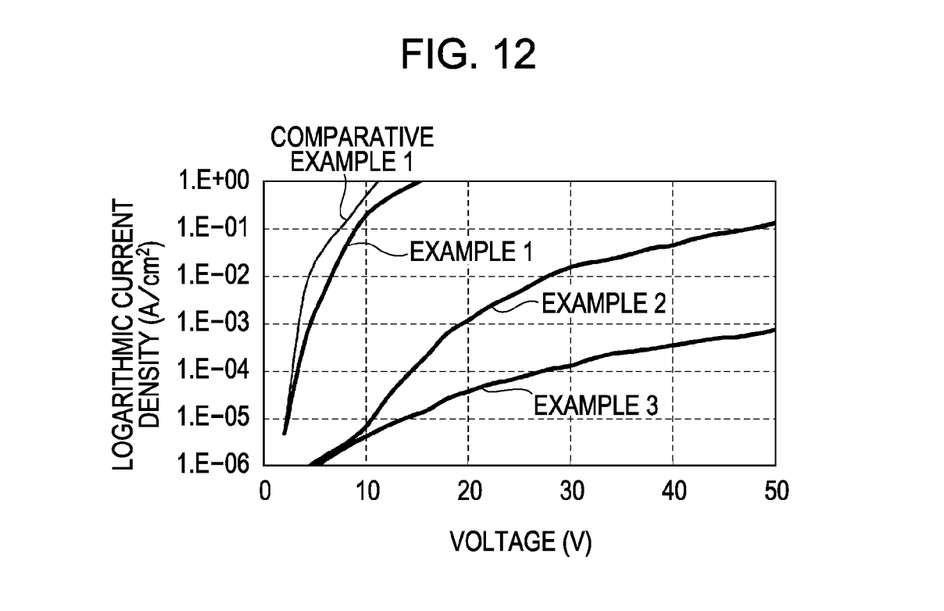
FIG. 12 illustrates I-V curves obtained in Examples 1 to 3 and Comparative Example 1.

The piezoelectric elements of Examples 1 to 3 and Comparative Example 1 were analyzed for the relationship between current density and voltage (the I-V curve) by measurement using 4140B pA meter/DC voltage source (Hewlett-Packard Company) at room temperature (25° C.). An electrode pattern with φ=500 μm was used during the measurement. The results are presented in FIG. 12. The analysis revealed that leakage current was reduced in Examples 1 to 3 compared with Comparative Example 1. This and the results of Test 1 indicate Pt was prevented from diffusing into the piezoelectric layer and leakage current was reduced in Examples 1 to 3. In Examples 2 and 3, which satisfied a relation K:Na:Nb:Bi:Fe=(1-x):x:1:a:a and met conditions $0<x<1$ and $0.03 \leq a \leq 0.05$, significantly improved insulation was observed.

Other Embodiments

The above is just an embodiment of the invention, and the basic constitution of the invention is not limited to the above. For example, the flow channel substrate 10 does not always have to be a silicon single crystal substrate as in the above-described embodiment; it may be an SOI substrate or made of glass or any other appropriate material.

Furthermore, the constitution of piezoelectric elements is not limited to that in the embodiment described above, where each piezoelectric element 300 consists of a first electrode 60, a piezoelectric layer 70, and a second electrode 80 stacked in this order on a substrate (a flow channel substrate 10). For example, some aspects of the invention can also be applied to longitudinal-vibration piezoelectric elements in which a piezoelectric material and an electrode material are alternately stacked and longitudinally stretched and shrunk.

Figure 13:
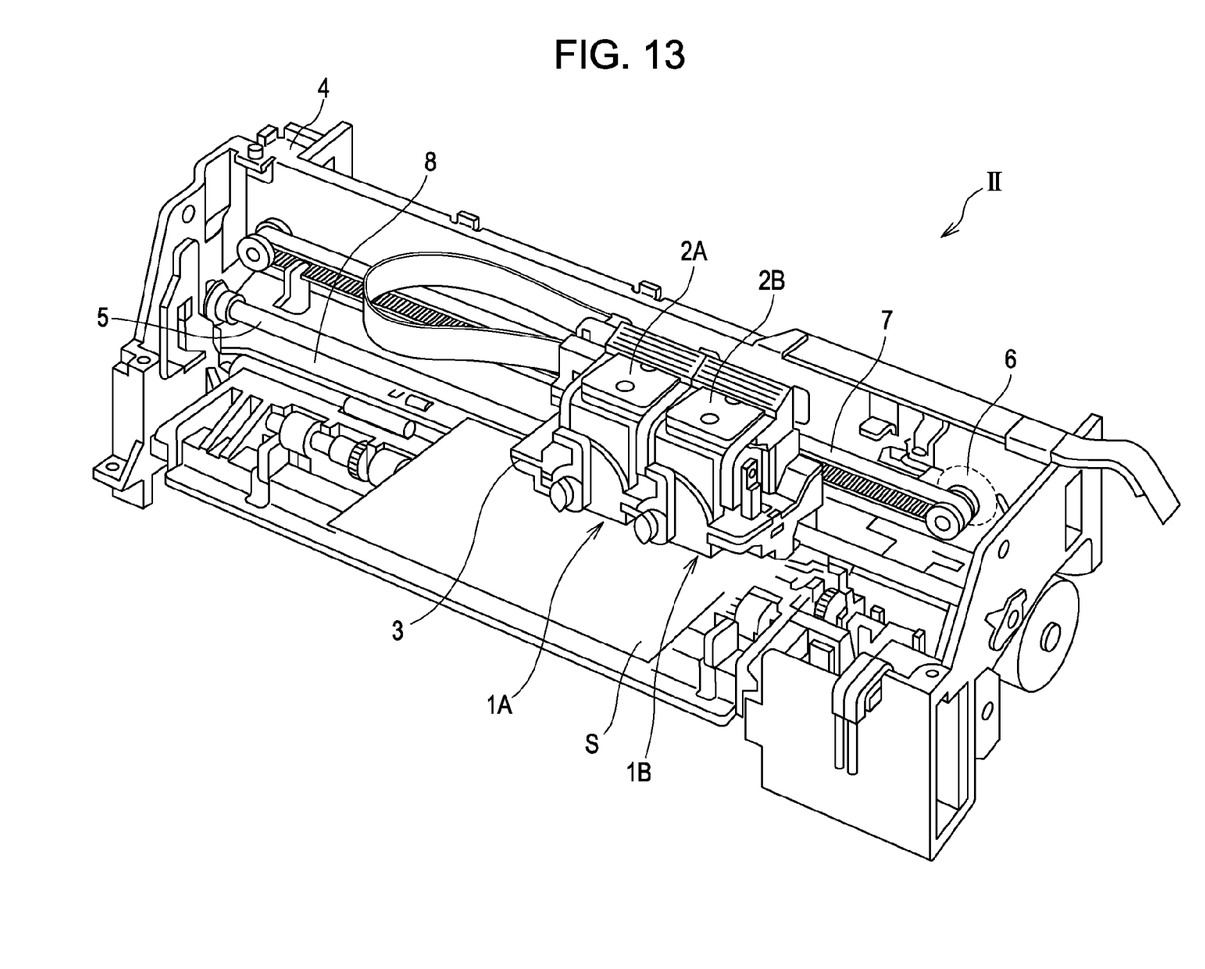
FIG. 13 illustrates a schematic constitution of a recording apparatus according to another embodiment of the invention.

Incidentally, ink jet recording heads according to these embodiments can be installed in ink jet recording apparatuses as a component of their recording head units each having an ink channel communicating with an ink cartridge or any other kind of ink container. FIG. 13 illustrates an example of this type of ink jet recording apparatus.

The ink jet recording apparatus II illustrated in FIG. 13 has two recording head units 1A and 1B, which are each equipped with the ink jet recording head I and carry detachable ink supply cartridges 2A and 2B, respectively. The main body 4 has a carriage shaft 5, along which the recording head units 1A and 1B can be freely moved on a carriage 3. In a typical constitution, the recording head unit 1A ejects a black ink composition, whereas the recording head unit 1B ejects a color ink composition.

Once a motor 6 is activated, the generated driving force is transmitted through gears (not illustrated) and a timing belt 7 to the carriage 3. As a result, the carriage 3 and the recording head units 1A and 1B carried thereon move along the carriage shaft 5. The main body 4 has a platen 8 extending along the carriage shaft 5; rollers or some other kind of feeding mechanism (not illustrated) feeds a recording sheet S (paper or some other kind of recording medium), which is then transported by the platen 8.

While the embodiment described above is an ink jet recording head as a typical liquid ejecting head, the invention may cover many other kinds of liquid ejecting heads including ones not used with ink. Examples of liquid ejecting heads covered by such aspects of the invention include recording heads for printers and other kinds of image recording apparatus, colorant ejecting heads for manufacturing color filters for liquid crystal displays and other kinds of displays, electrode material ejecting heads for forming electrodes for organic EL displays, field emission displays (FEDs), and other kinds of displays, and bioorganic substance ejecting heads for manufacturing biochips.

Furthermore, the invention may cover not only piezoelectric elements for ink jet recording heads and other types of liquid ejecting heads but also those for other machines, for example, sonar and other ultrasonic devices, ultrasonic motors, pressure sensors, and pyroelectric sensors such as IR sensors. Moreover, the invention can be applied to ferroelectric memories and other ferroelectric elements.

What is claimed is:

1. A piezoelectric element comprising:
a first electrode containing platinum;
a piezoelectric layer formed above the first electrode; and
a second electrode formed on the piezoelectric layer;
wherein the piezoelectric layer is composed of an oxide containing potassium, sodium, niobium, bismuth, and iron;
wherein when the piezoelectric element is analyzed by scanning in the thickness direction the amounts of bismuth and/or iron down from the second electrode using secondary ion mass spectrometer (SIMS; CAMECA SAS), the piezoelectric layer contains more bismuth and/or iron on the first electrode side than in the middle of the thickness thereof.

2. The piezoelectric element according to claim 1,
wherein the piezoelectric layer is perovskite structure.

3. A liquid ejecting head comprising the piezoelectric element according to claim 1.

4. A liquid ejecting apparatus comprising the liquid ejecting head according to claim 3.

* * * * *